United States Patent
Pamley et al.

(10) Patent No.: US 9,763,356 B2
(45) Date of Patent: Sep. 12, 2017

(54) CLOSED-LOOP CONTROL AND MONITORING IN COOLING ELECTRONIC COMPONENTS

(71) Applicant: Lenovo (Singapore) Pte. Ltd., Singapore (SG)

(72) Inventors: Marc Richard Pamley, Durham, NC (US); Timothy Samuel Farrow, Cary, NC (US); Omar Ali Ali, Morrisville, NC (US); William Fred Martin-Otto, Apex, NC (US)

(73) Assignee: Lenovo (Singapore) Pte. Ltd., Singapore (SG)

(*) Notice: Subject to any disclaimer, the term of this patent is extended or adjusted under 35 U.S.C. 154(b) by 448 days.

(21) Appl. No.: 14/226,395

(22) Filed: Mar. 26, 2014

(65) Prior Publication Data

US 2015/0282385 A1    Oct. 1, 2015

(51) Int. Cl.
*H05K 7/00* (2006.01)
*H05K 7/20* (2006.01)

(52) U.S. Cl.
CPC ......... *H05K 7/20209* (2013.01); *H05K 7/202* (2013.01); *H05K 7/20836* (2013.01)

(58) Field of Classification Search
None
See application file for complete search history.

(56) References Cited

U.S. PATENT DOCUMENTS

| | | | | |
|---|---|---|---|---|
| 6,487,463 B1* | 11/2002 | Stepp, III | ........... | G05D 23/1934 700/299 |
| 6,643,128 B2* | 11/2003 | Chu | ........... | G06F 1/206 318/471 |
| 6,972,951 B2* | 12/2005 | Schmid | ........... | G06F 1/20 165/121 |
| 7,203,063 B2* | 4/2007 | Bash | ........... | G06F 1/20 165/104.33 |
| 7,209,352 B2* | 4/2007 | Chen | ........... | H05K 7/20727 165/120 |
| 7,219,507 B1* | 5/2007 | Flachs | ........... | H05K 7/20209 62/186 |
| 8,223,025 B2* | 7/2012 | Stiver | ........... | H05K 7/20836 340/506 |
| 9,374,931 B2* | 6/2016 | Xu | ........... | H05K 7/20209 |
| 2001/0024358 A1* | 9/2001 | Bonet | ........... | H05K 7/20581 361/695 |

(Continued)

*Primary Examiner* — Christopher E Everett
(74) *Attorney, Agent, or Firm* — Ference & Associates LLC

(57) ABSTRACT

An embodiment provides a method, including: receiving, from a temperature sensor disposed within an electronic device, temperature input relative to a first heat generating component; the first heat generating component being upstream of a cooling element of the electronic device; receiving, from a temperature sensor disposed within an electronic device, temperature input relative to a second heat generating component; the second heat generating component being downstream of the cooling element; and controlling the cooling element to cool the first and second heat generating components based on both the temperature input relative to the first heat generating component and the temperature input relative to the second heat generating component. Other aspects are described and claimed.

20 Claims, 5 Drawing Sheets

(56) References Cited

U.S. PATENT DOCUMENTS

| | | | | |
|---|---|---|---|---|
| 2002/0054479 | A1* | 5/2002 | Wu | H05K 7/20727 |
| | | | | 361/695 |
| 2003/0234630 | A1* | 12/2003 | Blake | F04D 27/004 |
| | | | | 318/471 |
| 2004/0054938 | A1* | 3/2004 | Belady | G06F 1/3203 |
| | | | | 713/300 |
| 2005/0247067 | A1* | 11/2005 | Crippen | H05K 7/20 |
| | | | | 62/3.2 |
| 2006/0222045 | A1* | 10/2006 | Byquist | G01K 7/42 |
| | | | | 374/109 |
| 2009/0059516 | A1* | 3/2009 | Lai | G06F 1/20 |
| | | | | 361/679.48 |
| 2010/0321874 | A1* | 12/2010 | Bhattacharyya | H05K 7/20736 |
| | | | | 361/679.5 |
| 2011/0176275 | A1* | 7/2011 | Sato | G06F 1/206 |
| | | | | 361/695 |
| 2011/0222227 | A1* | 9/2011 | Xu | G06F 1/181 |
| | | | | 361/679.4 |
| 2011/0235261 | A1* | 9/2011 | Makley | G06F 1/20 |
| | | | | 361/679.33 |
| 2011/0235262 | A1* | 9/2011 | Cheng | G06F 1/20 |
| | | | | 361/679.33 |
| 2013/0060350 | A1* | 3/2013 | Peterson | G06F 1/26 |
| | | | | 700/12 |
| 2013/0100602 | A1* | 4/2013 | Zhang | G06F 1/20 |
| | | | | 361/679.31 |
| 2014/0085804 | A1* | 3/2014 | Song | G06F 1/183 |
| | | | | 361/679.33 |
| 2014/0092541 | A1* | 4/2014 | Zhang | G06F 1/20 |
| | | | | 361/679.5 |

* cited by examiner

CLOSED-LOOP CONTROL AND MONITORING IN COOLING ELECTRONIC COMPONENTS

BACKGROUND

Electronic devices such as computers, servers, and the like employ power supplies to supply power to motherboards, peripheral devices, and fans. Power supplies and other components, such as hard disk drives (HDDs), typically generate significant heat, which should be removed or dissipated for the components to function properly.

Distinct challenges have been noted in this connection, and an illustrative example involves central processing units (CPUs) of desktop computers that may be in the form of a "tower" disposed separately from a monitor and other components. Conventional efforts have involved a disposition of components into self-contained compartments or channels that are each separately cooled by different fans. However, especially in the case of compartments which contain a power supply, HDD and/or other component(s) prone to generate particularly significant heat, fan control is only tied to temperature conditions for one component, or restricted area, such as the power supply or its immediate vicinity. This has resulted in systems that offer coarse or unsuitable fan control, at best, relative to other components affected by fan airflow, thus running the risk of inadequate or excessive cooling for such components.

BRIEF SUMMARY

In summary, one aspect provides a method, comprising: receiving, from a temperature sensor disposed within an electronic device, temperature input relative to a first heat generating component; the first heat generating component being upstream of a cooling element of the electronic device; receiving, from a temperature sensor disposed within an electronic device, temperature input relative to a second heat generating component; the second heat generating component being downstream of the cooling element; and controlling the cooling element to cool the first and second heat generating components based on both the temperature input relative to the first heat generating component and the temperature input relative to the second heat generating component.

Another aspect provides an apparatus, comprising: a first heat generating component and a second heat generating component; one or more temperature sensors disposed to sense temperature of at least one of the first heat generating component and the second heat generating component; a cooling element; a processor operatively coupled to the cooling element and the one or more temperature sensors; and a memory that stores instructions executable by the processor to: receive, from a temperature sensor, temperature input relative to the first heat generating component; the first heat generating component being upstream of the cooling element; receive, from a temperature sensor, temperature input relative to the second heat generating component; the second heat generating component being downstream of the cooling element; and control the cooling element to cool the first and second heat generating components based on both the temperature input relative to the first heat generating component and the temperature input relative to the second heat generating component.

A further aspect provides a product, comprising: a storage device having code stored therewith, the code being executable by a processor and comprising: code that receives, from a temperature sensor disposed within an electronic device, temperature input relative to a first heat generating component; the first heat generating component being upstream of a cooling element of the electronic device; code that receives, from a temperature sensor disposed within the electronic device, temperature input relative to a second heat generating component; the second heat generating component being downstream of the cooling element; and code that controls the cooling element to cool the first and second heat generating components based on both the temperature input relative to the first heat generating component and the temperature input relative to the second heat generating component.

The foregoing is a summary and thus may contain simplifications, generalizations, and omissions of detail; consequently, those skilled in the art will appreciate that the summary is illustrative only and is not intended to be in any way limiting.

For a better understanding of the embodiments, together with other and further features and advantages thereof, reference is made to the following description, taken in conjunction with the accompanying drawings. The scope of the invention will be pointed out in the appended claims.

DETAILED DESCRIPTION

Figure 1:
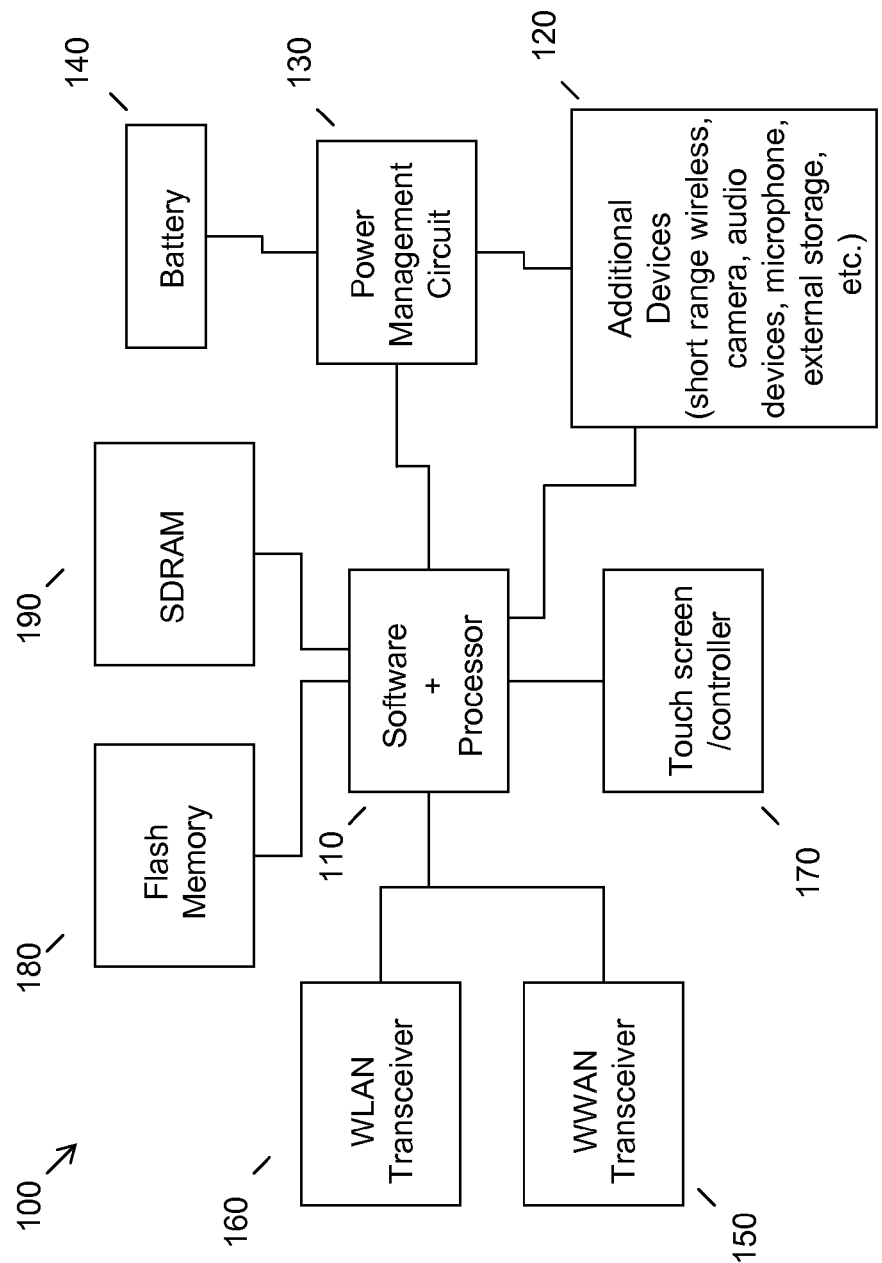
FIG. 1 illustrates an example of information handling device circuitry.

It will be readily understood that the components of the embodiments, as generally described and illustrated in the figures herein, may be arranged and designed in a wide variety of different configurations in addition to the described example embodiments. Thus, the following more detailed description of the example embodiments, as represented in the figures, is not intended to limit the scope of the embodiments, as claimed, but is merely representative of example embodiments.

Reference throughout this specification to "one embodiment" or "an embodiment" (or the like) means that a particular feature, structure, or characteristic described in connection with the embodiment is included in at least one embodiment. Thus, the appearance of the phrases "in one embodiment" or "in an embodiment" or the like in various places throughout this specification are not necessarily all referring to the same embodiment.

Furthermore, the described features, structures, or characteristics may be combined in any suitable manner in one or more embodiments. In the following description, numerous specific details are provided to give a thorough understanding of embodiments. One skilled in the relevant art will recognize, however, that the various embodiments can be practiced without one or more of the specific details, or with other methods, components, materials, et cetera. In other instances, well known structures, materials, or operations are not shown or described in detail to avoid obfuscation.

In certain computing systems, e.g., for example as described in commonly assigned U.S. Pat. No. 8,089,762 to Makley et al., a cooling channel cools more than one component in series. For example, a lower cooling channel may be used to cool the power supply and storage device (e.g., hard disk drives (HDDs) and/or solid state drives (SDDs)). In such an arrangement, the required airflow conventionally has been calculated based on the cooling requirements of a dominant component, e.g., the power supply, as well as the worst-case conditions of the other component, e.g., the HDDs. For the storage device cooling, then, a "brute-force" method of determining airflow is employed.

However, if either a lower number of HDDs are installed in the system, or drives which have lower thermal dissipation are used, the calculated airflow (i.e., the "worst case scenario") will be higher than necessary, resulting in louder acoustics and more power consumption. Additionally, if a more advanced drive with higher thermal dissipation is introduced at a later time, the previously calculated airflow may not be adequate enough to allow for proper cooling of the drive.

Accordingly, an embodiment defines a system-level approach of closed-loop monitoring and control of the airflow, e.g., for a particular multi-component cooling channel. The amount of cooling required in a two component channel is comprised of two high level criteria: the amount of airflow necessary to cool, e.g., the power supply, and the amount of airflow necessary to cool, e.g., the HDDs. The amount of airflow necessary to cool the power supply may be based on thermal sensor(s) near critical components inside the power supply. As these components increase in temperature, the sensors will dictate that the fan speed-up to increase the airflow.

An embodiment introduces additional closed loop monitoring of other components within the cooling channel. As a specific and non-limiting example, monitoring of the storage device (e.g., HDDs) is added by an embodiment. A microcontroller in the system, e.g., outside of the power supply, monitors various thermal conditions associated with the storage device in this channel. This includes, but is not necessarily limited to, air temperature "upstream" from the HDDs, air temperature "downstream" from the HDDs, and actual case temperatures of the HDDs themselves. If other or additional storage devices are present, appropriate monitoring may be implemented, as will be further appreciated by the examples used herein.

Based on these thermal inputs or monitoring, the microcontroller can use predefined algorithms to make real-time decisions on the amount of airflow needed to adequately cool the HDDs. Once determined, an embodiment will send this information back to the fan, e.g., in the power supply. Since the power supply fan now has two possible control points (in the example case, one from the sensors within the power supply and one from the microcontroller outside the power supply), it must make a decision on which control to use.

An embodiment may handle this by way of a comparator circuit, which effectively normalizes both controls to the same scale, and chooses the control requesting the higher/greater airflow. In this way, the higher of the two thermal conditions (in this case, the higher of the power supply and HDDs) is accounted for, but the airflow will still be kept to the lowest required amount to cool the entire channel considering the components of the channel being monitored.

Additionally, redundancy may be introduced, e.g., in the case that one of the thermal subsystems fails, the fan will continue to take input from the other. While no longer configured for optimal cooling, such redundancy does allow the user additional time to respond to the failure, in hopes of preventing a catastrophic thermal shutdown of the system.

The illustrated example embodiments will be best understood by reference to the figures. The following description is intended only by way of example, and simply illustrates certain example embodiments.

Figure 2:
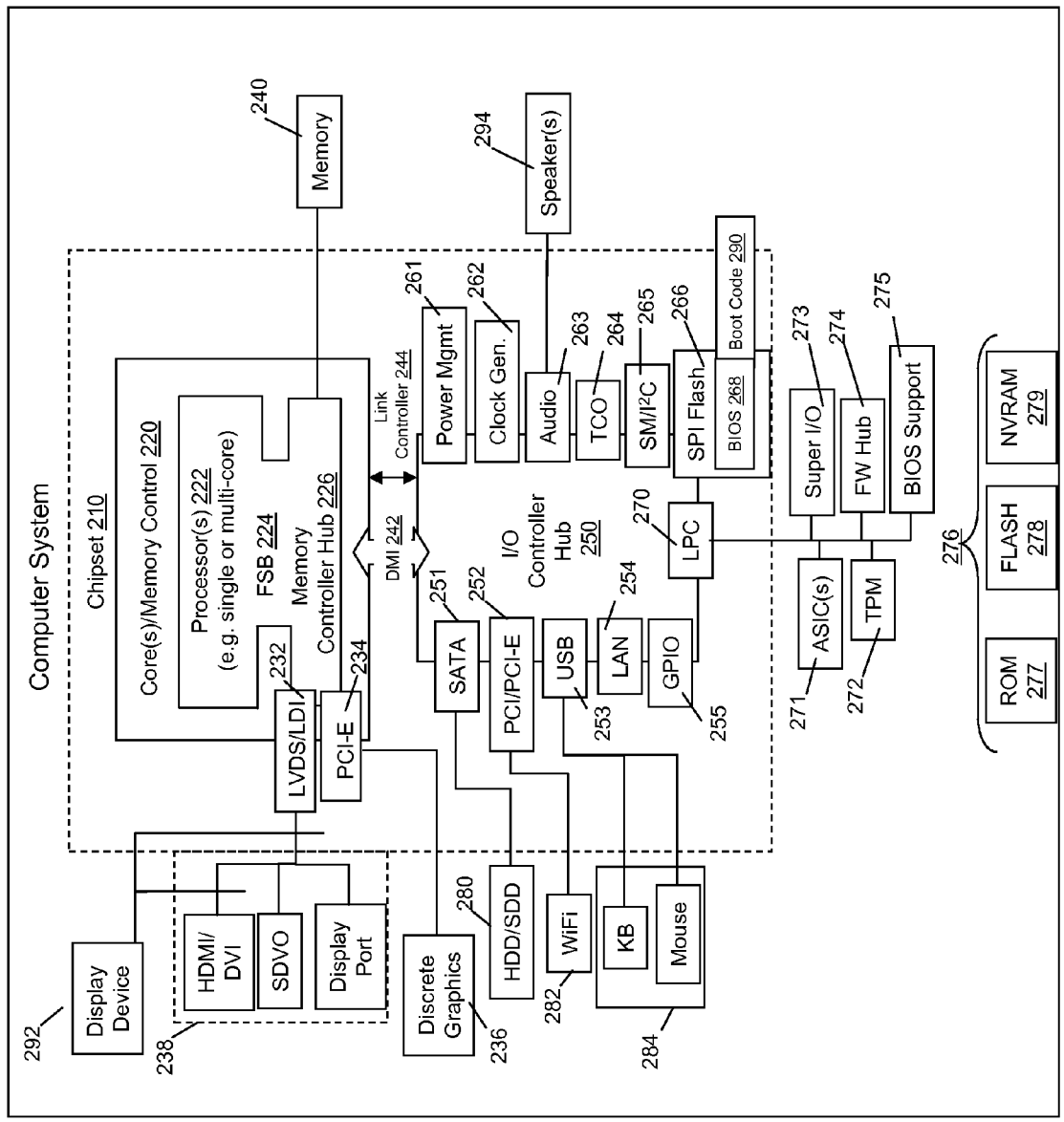
FIG. 2 illustrates another example of an information handling device.

FIGS. 1 and 2 relate to electronic components that may be included in mobile computing platforms and/or laptop computers. It should be understood and appreciated that components illustrated and described with respect to FIGS. 1 and 2, and aspects of the circuitry involved, may also be found and utilized in desktop computer systems and/or CPUs thereof, which themselves may serve as a context for embodiments as broadly contemplated herein.

While various other circuits, circuitry or components may be utilized in information handling devices, an example illustrated in FIG. 1 includes a system design found for example in tablet or other mobile computing platforms. Software and processor(s) are combined in a single unit 110. Internal busses and the like depend on different vendors, but essentially all the peripheral devices (120) may attach to a single unit 110. The circuitry 100 combines the processor, memory control, and I/O controller hub all into a single unit 110. Also, systems 100 of this type do not typically use SATA or PCI or LPC. Common interfaces for example include SDIO and I2C.

There are power management circuits(s) 130, e.g., a battery management unit, BMU, which manage power as supplied for example via a rechargeable battery 140, which may be recharged by a connection to a power source (not shown). In at least one design, a single unit, such as 110, is used to supply BIOS like functionality and DRAM memory.

System 100 typically includes one or more of a WWAN transceiver 150 and a WLAN transceiver 160 for connecting to various networks, such as telecommunications networks and wireless Internet devices, e.g., access points. Additional devices 120 are also commonly included. Commonly, system 100 will include a touch screen/controller 170 for data input and display. System 100 also typically includes various memory devices, for example flash memory 180 and SDRAM 190.

FIG. 2, for its part, depicts a block diagram of another example of information handling device circuits, circuitry or components. The example depicted in FIG. 2 may correspond to computing systems such as the THINKPAD series of personal computers sold by Lenovo (US) Inc. of Morrisville, N.C., or other devices. As is apparent from the description herein, embodiments may include other features or only some of the features of the example illustrated in FIG. 2.

The example of FIG. 2 includes a set 210 (a group of integrated circuits, or chips, that work together) with an architecture that may vary depending on manufacturer (for example, INTEL, AMD, ARM, etc.). INTEL is a registered trademark of Intel Corporation in the United States and other jurisdictions. AMD is a registered trademark of Advanced Micro Devices, Inc. in the United States and other jurisdictions. ARM is a trademark of ARM Holdings plc in various jurisdictions.

The architecture of the set 210 includes a core and memory control group 220 and an I/O controller hub 250 that exchanges information (for example, data, signals, commands, et cetera) via a direct management interface (DMI) 242 or a link controller 244. In FIG. 2, the DMI 242 is an interface (sometimes referred to as being a link between a "northbridge" and a "southbridge"). The core and memory control group 220 include one or more processors 222 (for example, single or multi-core) and a memory controller hub 226 that exchange information via a front side bus (FSB) 224; noting that components of the group 220 may be integrated in a unit that supplants the conventional "northbridge" style architecture.

In FIG. 2, the memory controller hub 226 interfaces with memory 240 (for example, to provide support for a type of RAM that may be referred to as "system memory" or "memory"). The memory controller hub 226 further includes a LVDS interface 232 for a display device 292 (for example, a CRT, a flat panel, touch screen, etc.). A block 238 includes some technologies that may be supported via the LVDS interface 232 (for example, serial digital video, HDMI/DVI, display port). The memory controller hub 226 also includes a PCI-express interface (PCI-E) 234 that may support discrete graphics 236.

In FIG. 2, the I/O hub controller 250 includes a SATA interface 251 (for example, for HDDs, SDDs, 280, etc.), a PCI-E interface 252 (for example, for wireless connections 282), a USB interface 253 (for example, for devices 284 such as a digitizer, keyboard, mice, cameras, phones, microphones, sensors, storage, other connected devices, etc.), a network interface 254 (for example, LAN), a GPIO interface 255, a LPC interface 270 (for ASICs 271, a TPM 272, a super I/O 273, a firmware hub 274, BIOS support 275 as well as various types of memory 276 such as ROM 277, Flash 278, and NVRAM 279), a power management interface 261, a clock generator interface 262, an audio interface 263 (for example, for speakers 294), a TCO interface 264, a system management bus interface 265, and SPI Flash 266, which can include BIOS 268 and boot code 290. The I/O hub controller 250 may include gigabit Ethernet support.

The system, upon power on, may be configured to execute boot code 290 for the BIOS 268, as stored within the SPI Flash 266, and thereafter processes data under the control of one or more operating systems and application software (for example, stored in system memory 240). An operating system may be stored in any of a variety of locations and accessed, for example, according to instructions of the BIOS 268. As described herein, a device may include fewer or more features than shown in the system of FIG. 2.

Figure 3:
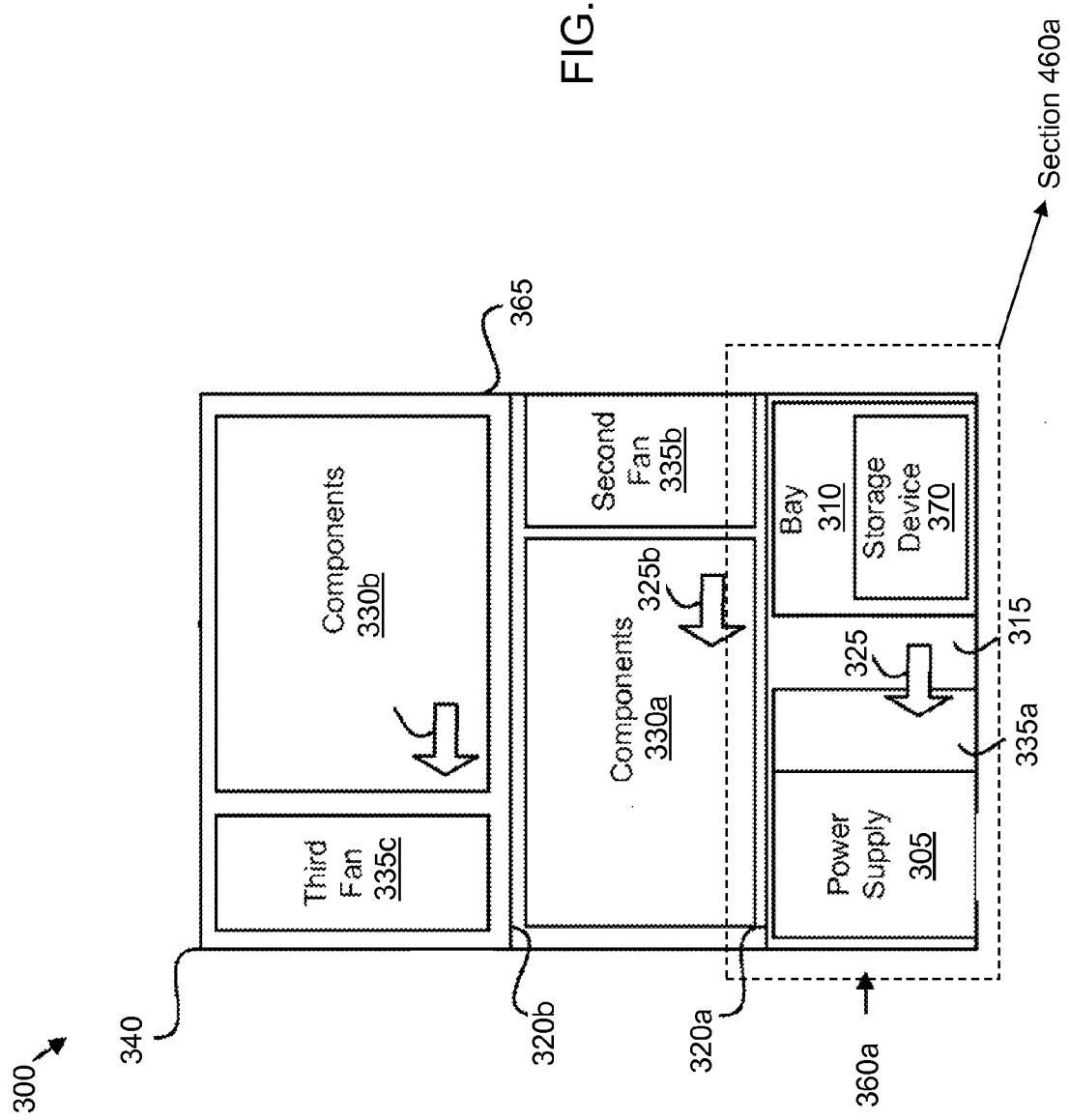
FIG. 3 provides a side view schematic drawing illustrating one embodiment of a computer.

Information handling device circuitry, as for example outlined in FIG. 1 or FIG. 2, may be used in environments such as a tower computer as illustrated in FIG. 3, and as will be better appreciated herebelow from the discussion of embodiments.

By way of an illustrative and non-restrictive example of a possible context in which at least one embodiment may be employed, FIG. 3 provides a side view schematic drawing illustrating a computer 300, which may be a tower computer. The computer 300 includes a chassis 340, a power supply 305, a plurality of fans 335(a-c), a chamber 315, a bay 310, a plurality of baffles 320(a-b), and a plurality of other heat generating components 330. Further details of an example of a computer such as that shown in FIG. 3, and of its associated components, may be found in commonly assigned U.S. Pat. No. 8,089,762 to Makley et al.

The power supply 305 may supply electrical power to a plurality of devices and components within the chassis 340 and thus acts as a heat generating component that is cooled by an airflow 325 of a cooling element, e.g., fan 335a. For example, the power supply 305 may supply electrical power to the fans 335(a-c), the components 330, the storage device 370, etc. In one embodiment, the power supply 305 supplies electrical power to all devices and components within the chassis 340.

The bay 310 and storage device 370 (e.g., analogous to that indicated at 280 in FIG. 2) act as heat generating components and thus may be located such that airflow 325 produced by a single fan 335a cools the storage device 370 and the power supply 305, e.g., in series as illustrated. The storage device 370 may be a hard disk drive, a solid-state drive (SSD), or the like. (In a variant embodiment, more than one fan may be used in place of the single fan 335a for the purposes described herein in connection with fan 335a.)

In one embodiment, the power supply 305 comprises a first fan 335a. Alternatively, the first fan 335a may be a separate device from the power supply 305. The first fan 335a may be disposed between the power supply 305 and the chamber 315 to motivate a first airflow 325 as indicated in the example illustration of FIG. 3.

In one embodiment, the chamber 315 is a volume of negative air pressure relative to an ambient air pressure outside of the chassis 340. For example, the first fan 335a may motivate the first airflow 325 from the chamber 315 and through the power supply 305, cooling the power supply 305.

In an alternate embodiment, the chamber 315 is a volume of positive air pressure relative to the ambient air pressure outside of the chassis 340. The first fan 335a may draw the first airflow 325 through the power supply 305 into the chamber 315.

Conventionally, in an arrangement such as that illustrated in FIG. 3, cooling of the lower chamber 315 is governed by calculations based on cooling requirements of the power supply 305 as well as "worst-case" conditions associated with storage device 370. The amount of airflow necessary to cool the power supply 305 is based on one or more inputs that may derive from one or more thermal sensors near critical components inside the power supply 305. As these power supply 305 components increase in temperature, such sensors will govern an increase in the operating speed of fan 335a, to thereby increase airflow. As long as worst-case conditions of the included storage device 370 are taken into account and included in such calculations, adequate cooling of storage device 370 will usually be ensured. However, among other challenges, this does not allow for any changes in the nature, composition or disposition of storage device 370 (and/or one or more other components besides that power supply 305 that need to be cooled), such that any such changes may then result in under- or over-cooling of a storage device or one or more other components.

Figure 4:
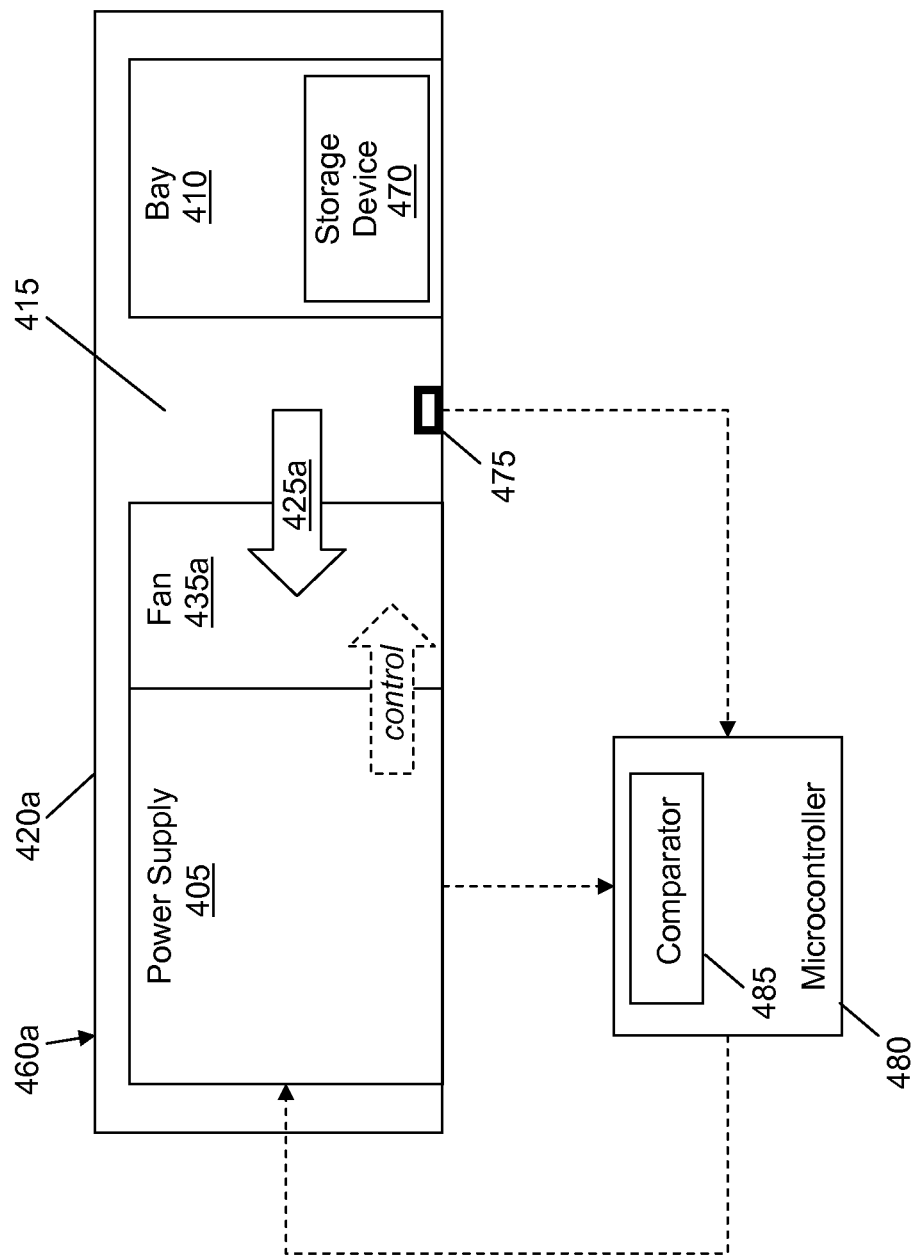
FIG. 4 provides a side view schematic drawing illustrating a section of a computer such as that shown in FIG. 3.

As such, in accordance with an embodiment, FIG. 4 provides a side view schematic drawing illustrating a self-contained computer section similar to that indicated at 360a in FIG. 3. Here, section 460a may similarly represent a bottom section of a tower computer, with airflow there through constrained by an upper baffle 420a. A power supply 405 powers and controls a fan 435a which urges airflow 425a through chamber 415 in a direction towards fan 435a, to assist in the dissipation of heat from a vicinity of a storage device 470 (e.g., an HDD, a solid-state drive (SSD), etc.) contained in bay 410.

In an embodiment, a suitable sensor 475 is provided in chamber 415 to measure an ambient temperature. Based on the relative physical positioning of sensor 475, and possibly on one or more other initial or calibrating inputs, the sensor can effectively determine a temperature associated with storage device 470 and/or one or more other components. An input constituting this determined temperature is then sent to a microcontroller 480. Alternatively, the sensor 475 may provide merely a raw temperature reading which then is accepted as/is at the microcontroller 480, or undergoes recalculation at microcontroller 480 to determine a temperature estimate for an immediate vicinity of storage device 470, based on the physical positioning of sensor 475 and possibly on one or more other initial or calibrating inputs. In one variant embodiment, sensor 475 may be positioned in a more immediate vicinity of storage device 470 itself (e.g., within the storage device 470 itself). In another variant embodiment, two or more sensors 475 may each be positioned within chamber 415, and/or in a more immediate vicinity of storage device 470, with their raw or modified measurements then being sent to microcontroller 480 for averaging or for another suitable type of recalculation.

In an embodiment, microcontroller 480 is disposed in a physical location away from power supply 405, possibly within the same chamber 415 or in another computer section. In a variant embodiment, microcontroller 480 may even be positioned away from the computer itself. In another variant embodiment, it may form a constituent (e.g., built-in, retrofitted or supplemental) part of power supply 405.

In an embodiment microcontroller 480 serves to send a signal to power supply 405, e.g., to a control circuit, to control one or more operating parameters of the fan 435*a* (e.g., fan speed, on/off) based on the determined temperature in a vicinity of storage device 470 and/or of one or more other components. (This can be the same control circuit within power supply 405 that may already control fan 435*a* based on one or more inputs related to operating temperature of the power supply 405 and/or one or more components thereof.) In this manner, an adjustment of one or more operating parameters of fan 435*a* can be undertaken in a manner that more readily addresses actual temperature conditions of storage device 470 (and/or one or more other components) rather than impose an operating parameter (or set of parameters) on the fan 435*a* that considers nothing but conditions of power supply 405 (and/or one or more other components thereof, e.g., a worst case scenario for a predetermined storage device, e.g., storage device 470).

Thus, by way of illustrative example, should an original storage device 470 be replaced by another storage device that is prone to result in a different pattern of ambient temperature conditions in an immediate vicinity of the storage device and/or in one or more other portions of chamber 415, fan 435*a* can readily adapt to such changed conditions to forestall inadequate or excessive fan operation alike (and, in the latter case, the possibility of added noise from excessive fan operation), and thus avoid under- or over-cooling of the storage device 470.

In an embodiment, temperature measurements related to the power supply 405 (and/or one or more components thereof) and those related to storage device 470 (and/or one or more other components outside of power supply 405) can be reconciled via a comparator circuit 485 of microcontroller 480, such that one or more inputs necessitating a higher airflow override one or more others. Thus, for instance, should measured operating temperatures of storage device 470 warrant greater airflow than might be necessitated by the measured operating temperature(s) of power supply 405 alone or in combination with a predetermined storage device, comparator 485 can prompt acceptance of the inputs of sensor 475 relating to storage device 470 to thereby control fan 435*a*. By way of another advantage of such an arrangement, in the event of failure of one or more temperature sensors related to one component or another (e.g., sensors for the power supply 405 or storage device 470), at least some degree of cooling can be ensured while reducing the risk of thermal shutdown that may otherwise arise from the fan ceasing to operate altogether.

Figure 5:
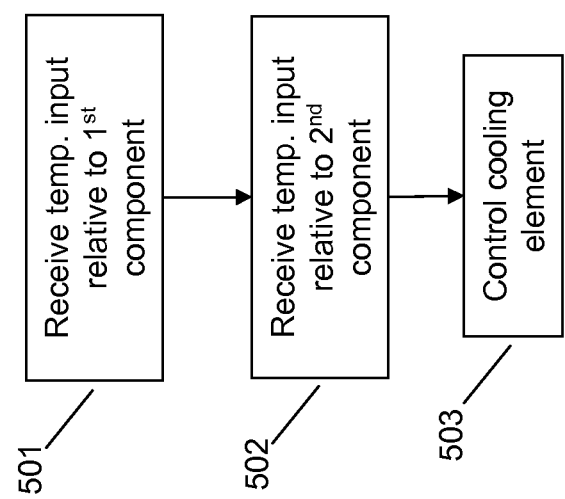
FIG. 5 illustrates an example method of controlling a cooling element.

Referring to FIG. 5, an embodiment may serve to control a cooling element. An embodiment may receive temperature input relative to a first component (501), e.g., a storage device such as storage device 470, and receive temperature input relative to a second component (502), e.g., a power supply such as power supply 405. An embodiment may control a cooling element such as fan 425*a* to cool the first and second components (503) using the temperature inputs. The controlling includes calculating at least one parameter to control the cooling element, and the calculating includes incorporating both the temperature input relative to the first component and the temperature input relative to the second component.

It should be appreciated and understood that a great number of variants are conceivable in addition to those embodiments otherwise discussed and broadly contemplated herein. For instance, while specific mention is made herein of storage devices and of sensing temperatures associated therewith, embodiments can address cooling needs of a great variety of other components, whether considered in conjunction with thermal inputs from a power supply or from one or more other components.

While specific mention is made herein of cooling components in a distinct channel or chamber of a tower computer, constrained by a baffle such that airflow from a fan is more or less exclusively dedicated to cooling components solely within such a channel or chamber, solutions as broadly contemplated herein are not restricted to such an environment. For instance, though possibly less effective from a standpoint of efficient or targeted cooling, embodiments as broadly contemplated herein may be applied to a tower computer arrangement where essentially only one larger internal channel or chamber exists; sensing inputs from different component sources can still be accommodated in such an environment, and cooling calculations and decisions made essentially in an analogous manner as described herein.

Among the possible operating parameters of a fan that can be controlled, while specific mention is made herein of fan speed (to the extent that it can govern airflow through a chamber), other parameters can also be controlled as appropriate. These may include, but need not be limited to an on/off function of the fan and a time-based operating profile of the fan. In the latter case, certain sensed ambient temperatures or temperature patterns may prompt a time-dependent profile of one or more fan speeds over a predetermined time period (e.g., responsive to excessive heating of one or more components measured in several instances or continually over a given time period); thus, in accordance with embodiments broadly contemplated herein, certain sensed conditions relative to one component may trigger the institution of such a time-dependent profile to control the fan, possibly in the process overriding (e.g., via a comparator as discussed herein) any inputs from another component that might otherwise control the fan.

As will be appreciated by one skilled in the art, various aspects may be embodied as a system, method or device program product. Accordingly, aspects may take the form of an entirely hardware embodiment or an embodiment including software that may all generally be referred to herein as a "circuit," "module" or "system." Furthermore, aspects may take the form of a device program product embodied in one or more device readable medium(s) having device readable program code embodied therewith.

Any combination of one or more non-signal device readable storage medium(s) may be utilized. A storage medium may be, for example, an electronic, magnetic, optical, electromagnetic, infrared, or semiconductor system, apparatus, or device, or any suitable combination of the foregoing. More specific examples of a storage medium would include the following: a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a storage medium is not a signal and "non-transitory" includes all media except signal media.

Program code embodied on a storage medium may be transmitted using any appropriate medium, including but not limited to wireless, wireline, optical fiber cable, RF, et cetera, or any suitable combination of the foregoing.

Program code for carrying out operations may be written in any combination of one or more programming languages. The program code may execute entirely on a single device, partly on a single device, as a stand-alone software package, partly on single device and partly on another device, or entirely on the other device. In some cases, the devices may be connected through any type of connection or network, including a local area network (LAN) or a wide area network (WAN), or the connection may be made through other devices (for example, through the Internet using an Internet Service Provider), through wireless connections, e.g., near-field communication, or through a hard wire connection, such as over a USB connection.

Example embodiments are described herein with reference to the figures, which illustrate example methods, devices and program products according to various example embodiments. It will be understood that the actions and functionality may be implemented at least in part by program instructions. These program instructions may be provided to a processor of a general purpose information handling device, a special purpose information handling device, or other programmable data processing device to produce a machine, such that the instructions, which execute via a processor of the device implement the functions/acts specified.

It is worth noting that while specific blocks are used in the figures, and a particular ordering of blocks has been illustrated, these are non-limiting examples. In certain contexts, two or more blocks may be combined, a block may be split into two or more blocks, or certain blocks may be re-ordered or re-organized as appropriate, as the explicit illustrated examples are used only for descriptive purposes and are not to be construed as limiting.

As used herein, the singular "a" and "an" may be construed as including the plural "one or more" unless clearly indicated otherwise.

This disclosure has been presented for purposes of illustration and description but is not intended to be exhaustive or limiting. Many modifications and variations will be apparent to those of ordinary skill in the art. The example embodiments were chosen and described in order to explain principles and practical application, and to enable others of ordinary skill in the art to understand the disclosure for various embodiments with various modifications as are suited to the particular use contemplated.

Thus, although illustrative example embodiments have been described herein with reference to the accompanying figures, it is to be understood that this description is not limiting and that various other changes and modifications may be affected therein by one skilled in the art without departing from the scope or spirit of the disclosure.

What is claimed is:

1. A method, comprising:
   receiving, from a temperature sensor disposed within an electronic device, temperature input associated with a temperature of a first heat generating component;
   the first heat generating component being upstream of a cooling element of the electronic device;
   receiving, from a second temperature sensor disposed within the electronic device, temperature input associated with a temperature of a second heat generating component;
   the second heat generating component being downstream of the cooling element; and
   controlling the cooling element to cool the first and second heat generating components based on both the temperature associated with the first heat generating component and the temperature associated with the second heat generating component, wherein the controlling comprises normalizing the temperature associated with the first heat generating component and the temperature associated with the second heat generating component, identifying, from the normalized temperature associated with the first heat generating component and the normalized temperature associated with the second heat generating component, the first heat generating component or the second heat generating component having a higher normalized temperature of the respective normalized temperatures and necessitating a higher airflow, and controlling the cooling element based upon the higher normalized temperature necessitating a higher airflow.

2. The method of claim 1, wherein said controlling comprises comparing the normalized temperature input relative to the first heat generating component and the normalized temperature input relative to the second heat generating component.

3. The method of claim 2, wherein:
   the temperature input relative to the first heat generating component comprises a first input and the temperature input relative to the second heat generating component comprises a second input; and
   wherein identifying from the normalized temperature associated with the first heat generating component and the normalized temperature associated with the second heat generating component necessitating a higher airflow comprises determining which one of the first and second inputs will result in greater cooling for the first and second heat generating components.

4. The method of claim 1, wherein the second heat generating component comprises a power supply.

5. The method of claim 4, wherein the first heat generating component comprises a storage device.

6. The method of claim 5, wherein the cooling element comprises a fan.

7. The method of claim 6, wherein said controlling comprises controlling the fan via a control circuit in the power supply.

8. The method of claim 7, wherein said controlling comprises sending a signal to the control circuit based on the temperature input relative to the first heat generating component and the temperature input relative to the second heat generating component.

9. The method of claim 8, wherein said sending is performed from a microcontroller disposed separately from the power supply.

10. The method of claim 7, wherein the controlling comprises controlling fan speed.

11. An apparatus, comprising:
a first heat generating component and a second heat generating component;
one or more temperature sensors disposed to sense temperature of at least one of the first heat generating component and the second heat generating component;
a cooling element;
a processor operatively coupled to the cooling element and the one or more temperature sensors; and
a memory that stores instructions executable by the processor to:
receive, from a temperature sensor, temperature input associated with a temperature of the first heat generating component;
the first heat generating component being upstream of the cooling element;
receive, from a second temperature sensor, temperature input associated with a temperature of the second heat generating component;
the second heat generating component being downstream of the cooling element; and
control the cooling element to cool the first and second heat generating components based on both the temperature associated with the first heat generating component and the temperature associated with the second heat generating component, wherein to control comprises normalizing the temperature associated with the first heat generating component and the temperature associated with the second heat generating component, identifying, from the normalized temperature associated with the first heat generating component and the normalized temperature associated with the second heat generating component, the first heat generating component or the second heat generating component having a higher normalized temperature of the respective normalized temperatures and necessitating a higher airflow, and controlling the cooling element based upon the higher normalized temperature necessitating a higher airflow.

12. The apparatus of claim 11, wherein to control comprises comparing the normalized temperature input relative to the first heat generating component and the normalized temperature input relative to the second heat generating component.

13. The apparatus of claim 12, wherein:
the temperature input relative to the first heat generating component comprises a first input and the temperature input relative to the second heat generating component comprises a second input; and
wherein identifying from the normalized temperature associated with the first heat generating component and the normalized temperature associated with the second heat generating component necessitating a higher airflow comprises determining which one of the first and second inputs will result in greater cooling for the first and second heat generating components.

14. The apparatus of claim 11, wherein the second heat generating component comprises a power supply.

15. The apparatus of claim 14, wherein the first heat generating component comprises a storage device.

16. The apparatus of claim 15, wherein the cooling element comprises a fan.

17. The apparatus of claim 16, wherein to control comprises controlling the fan via a control circuit in the power supply.

18. The apparatus of claim 17, wherein to control comprises sending a signal to the control circuit based on the temperature input relative to the first heat generating component and the temperature input relative to the second heat generating component.

19. The apparatus of claim 18, wherein said sending is performed from a microcontroller disposed separately from the power supply.

20. A product, comprising:
a storage device having code stored therewith, the code being executable by a processor and comprising:
code that receives, from a temperature sensor disposed within an electronic device, temperature input associated with a temperature of a first heat generating component;
the first heat generating component being upstream of a cooling element of the electronic device;
code that receives, from a second temperature sensor disposed within the electronic device, temperature input associated with a temperature of a second heat generating component;
the second heat generating component being downstream of the cooling element; and
code that controls the cooling element to cool the first and second heat generating components based on both the temperature associated with the first heat generating component and the temperature associated with the second heat generating component, wherein the code that controls comprises code that normalizes the temperature associated with the first heat generating component and the temperature associated with the second heat generating component, identifies, from the normalized temperature associated with the first heat generating component and the normalized temperature associated with the second heat generating component, the first heat generating component or the second heat generating component having a higher normalized temperature of the respective normalized temperatures and necessitating a higher airflow, and controlling the cooling element based upon the higher normalized temperature necessitating a higher airflow.

* * * * *